United States Patent [19]
Kimura

[11] Patent Number: 5,637,549
[45] Date of Patent: Jun. 10, 1997

[54] RECORDING MATERIALS

[75] Inventor: Yoshihisa Kimura, Urawa, Japan

[73] Assignee: Kimoto Co., Ltd., Japan

[21] Appl. No.: 577,002

[22] Filed: Dec. 26, 1995

[30] Foreign Application Priority Data

Dec. 28, 1994 [JP] Japan .................................. 6-329049

[51] Int. Cl.⁶ .............................. B41M 5/30; B41M 5/34
[52] U.S. Cl. .................... 503/204; 430/141; 430/155; 430/156; 503/200; 503/202; 503/215; 503/226
[58] Field of Search .................................. 430/141, 155, 430/156; 503/200, 202, 204, 215, 226

[56] References Cited

U.S. PATENT DOCUMENTS 5,569,541  10/1996  Kimura et al. .......................... 428/520

Primary Examiner—Bruce H. Hess
Attorney, Agent, or Firm—Lorusso & Loud

[57] ABSTRACT

A recording material comprising a plastic film provided with a layer of ionizing radiation cured resin having a hardness equal to or harder than a pencil hardness of H and an image-forming layer having pressure sensitivity or thermal sensitivity or photosensitivity and thermal sensitivity, wherein rippling during storage in high humidity or caused by heat is markedly reduced.

20 Claims, 2 Drawing Sheets

RECORDING MATERIALS

BACKGROUND OF THE INVENTION

1. Field of the Invention

The present invention relates to a recording material which enables monochrome or multi-color recording by utilizing pressure, light or heat and, in particular, it relates to a recording material which can reduce rippling of whole film caused by heat and waving of film edges caused by moisture.

2. Prior Art

Various recording methods utilizing light energy, heat energy and pressure in combination have been used for facsimile machines, various printers and the like. Recording materials used for these methods have an image-forming layer composed of a layer containing a coloring agent such as diazo compounds and lueco dyes, a layer containing a substance reacting with the coloring agent to develop color (color developing agent) and an intermediate layer separating the layers, the image-forming layer being provided on a support such as paper sheets and plastic films. In these materials, by encapsulating either of the coloring agent or the color developing agent in microcapsules which can be broken by pressure or in microcapsules which are composed of separator membranes showing extremely low permeability at room temperature but showing increased permeability under heating, the coloring agent and the color developing agent may be exist in the same layer and hence extremely wide variety of coloring agents can be used. Thus, those materials used for multi-color image-forming methods are produced at present.

As such recording materials utilizing the coloring agent and the color developing agent, there have been pressure sensitive paper and heat sensitive paper having layers each containing each of those agents separated by a separator layer and those containing the coloring agent and the color developing agent either of which is encapsulated in microcapsules. In these papers, the coloring agent and the color developing agent are separated from each other by separator layers or microcapsules walls and they are broken by pressurizing by typewriters or ball-point pens or by heating thermal heads to cause the reaction of the coloring agent and the color developing agent. There has also been heat sensitive paper where a colored layer containing the coloring agent and the color developing agent is decolorized by heating with a thermal head to typewrite characters.

As recording materials utilizing diazo compounds, there have been light and heat sensitive paper comprising a diazo compound, a coupler and a base in the same layer, the diazo compound being encapsulated in microcapsules showing no permeability at room temperature so that the diazo compound, the coupler and the base are prevented from causing reaction at room temperature. Such materials are heated image-wise with thermal heads or the like to increase permeability of the microcapsules so that the reaction of the diazo compound and the coupler and hence color development may be occur, and the diazo compound in non-image areas are inactivated by light exposure.

Further, as recording materials utilizing leuco dyes, there have been light and heat sensitive paper comprising, in the same layer, a leuco dye and a photo-oxidizing agent either of which is encapsulated in microcapsules, like those utilizing the diazo compound mentioned above. Such materials are exposed to light image-wise to cause the reaction of the leuco dye and the photo-oxidizing agent and color development, and the photo-oxidizing agent in non-image areas is made react with a reducing agent and inactivated by heating.

Furthermore, as recording materials utilizing photo-curing reaction, there has been light and heat sensitive paper comprising, in the same layer, a coloring agent, a photo-curing agent and a color developing agent, the coloring agent and the photo-curing agent being encapsulated in microcapsules so that these agent cannot cause reaction at room temperature. In these materials, the photo-curing agent in non-image areas is cured by light exposure and thereafter the color developing agent and the photo-curing agent are made react with each other by heating to develop color, i.e., to form images.

Recording materials utilizing paper sheets as their supports do not show marked deformation on heating for forming images. However, recording materials utilizing plastic sheets as their supports are likely to show deformation because plastic films generally have a relatively low heat deformation temperature. For example, polyester, which is the most commercially popular plastic material for the support, has a glass transition temperature of about 70° C. and, if a plastic film composed of it is employed for a use where it is heated to a temperature above its glass transition temperature, the film would be softened and hence deformed. When recording materials utilizing plastic films as supports are used as printing sheets, the materials are deformed due to heating and they are given a very wavy form as a whole. Such phenomena are particularly remarkable in machines using a high temperature and, in such machines, the sheets would cause jamming in the sheet transfer route.

Therefore, plastic films can be used for such purpose only in machines using a low image-forming temperature and a short heating time and machines using a high heating temperature cannot use materials utilizing plastic films as supports, but only those utilizing paper sheets.

Further, recording materials comprising plastic films are usually cut into sheets and stacked or rolled for their storage. The films stored in the form of stacked sheets or rolled film absorb moisture from four edge sides in the case of stacked sheets and from both ends of roll in the case of rolled sheets and they exhibit wavy edges (so-called "petal phenomenon") when they are spread or unrolled.

As a method for preventing the petal phenomenon, humidity controlling paper sheets containing a controlled amount of moisture have been interleaved between adjacent films to reduce the influence of outside air humidity. In this method, the additional process step for interleaving the humidity controlling paper sheets is inevitable and the paper sheets must be pealed and discarded upon use of the films. These steps make the process troublesome and may cause problems from the viewpoint of resource-saving.

The object of the present invention is to solve the above problems and to provide a recording material less susceptible to waving of the whole film caused by heat and edge waving caused by moisture. A further object of the present invention is to provide recording material which retains flat form and does not cause jamming even when it is used in machines utilizing a high heating temperature, and in which the petal phenomenon caused by moisture absorption upon its storage is prevented.

SUMMARY OF THE INVENTION

To achieve the above objects, the recording material of the present invention comprises a plastic film provided with a layer of ionizing radiation cured resin having a hardness equal to or harder than a pencil hardness of H and an image-forming layer having pressure sensitivity or thermal sensitivity or photosensitivity and thermal sensitivity.

In one embodiment of the present invention, the recording material of the present invention comprises a plastic film which is provided on at least one of its surfaces with a layer of ionizing radiation cured resin having a hardness equal to or harder than a pencil hardness of H and, an image forming layer having pressure sensitivity or thermal sensitivity or photosensitivity and thermal sensitivity which is provided on the plastic film or on the layer of ionizing radiation cured resin.

In one embodiment of the present invention, the recording material of the present invention comprises a plastic film which is provided on both of its surfaces with layers of ionizing radiation cured resin having a hardness equal to or harder than a pencil hardness of H and, an image-forming layer having pressure sensitivity or thermal sensitivity or photosensitivity and thermal sensitivity, which is provided on at least one of the layers of ionizing radiation cured resin.

In one embodiment of the present invention, the recording material of the present invention comprises a plastic film which is provided on at least one of its surfaces with a layer of ionizing radiation cured resin having a hardness equal to or harder than a pencil hardness of H and an image-forming layer having pressure sensitivity or thermal sensitivity or photosensitivity and thermal sensitivity in this order.

In one embodiment of the present invention, the recording material of the present invention comprises a plastic film which is provided on one of its surfaces with an image-forming layer and on the opposite surface with a layer of ionizing radiation cured resin having a hardness equal to or harder than a pencil hardness of H.

In one embodiment of the present invention, the recording material of the present invention comprises a plastic film which is provided on at least one of its surfaces with an image-forming layer having pressure sensitivity or thermal sensitivity or photosensitivity and thermal sensitivity, and a layer of ionizing radiation cured resin having a hardness equal to or harder than a pencil hardness of H in this order.

In one embodiment of the present invention, the recording material of the present invention comprises a plastic film which is provided on one of its surfaces with an image-forming layer having pressure sensitivity or thermal sensitivity or photosensitivity and thermal sensitivity and a layer of ionizing radiation cured resin having a hardness equal to or harder than a pencil hardness of H in this order, and on the opposite surface with a layer of ionizing radiation cured resin having a hardness equal to or harder than a pencil hardness of H.

According to the present invention, the image-forming layer may be composed of one layer comprising a coloring agent and a color developing agent, or a plurality of layers comprising at least one containing a coloring agent and at least one containing a color developing agent. Further, either the coloring agent or the color developing agent may be encapsulated in microcapsules. Microcapsules may be those which can be broken by pressure, those which can be made permeable for the agents by heating or the like.

According to the present invention, the image-forming layer may contain a diazo compound, a coupler and a solid base as a color developing system. In such a case, the image-forming layer may be composed of a plurality of layers each containing one of different diazo compounds so that the layers can develop different colors, each of the diazo compounds or a coupler contained in each of the layers being encapsulated in microcapsules which have thermopermeability properties different in every layer.

According to the present invention, the image-forming layer may contain a leuco dye, an oxidizing agent and a reducing agent as an alternative color developing system. In such a case, the image-forming layer may be composed of a plurality of layers each containing one of different leuco dyes which bind with an oxidizing agent at different wavelengths so that the layers may develop different colors.

Further, the image-forming layer may comprise a layer containing a leuco dye and a layer comprising a diazo compound which decomposed at a wavelength different from that at which the leuco dye develops color.

The image-forming layer may comprise a photopolymerizable monomer, a polymerization initiator and a coloring agent as an alternative color developing system. In such a case, the image-forming layer may be composed of a plurality of layers each containing one of different photopolymerizable monomers which undergo polymerization at different wavelengths and one of different coloring agents developing different colors.

DETAILED DESCRIPTION OF THE INVENTION

The recording material of the present invention will be explained more in detail below.

Figure 1:
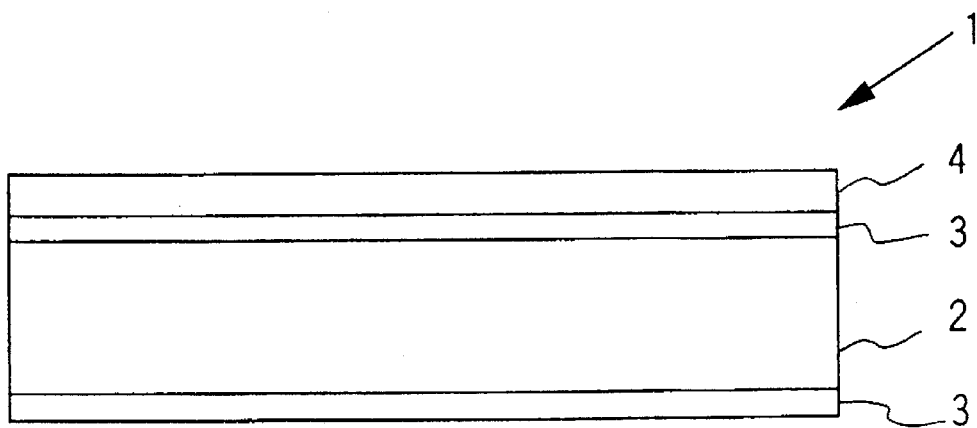
FIG. 1 is a cross-sectional view of an embodiment of a recording material according to the present invention wherein the recording material 1 comprises a plastic film 2, ionizing radiation cured resin layers 3 and image-forming layer 4.
Figure 2:
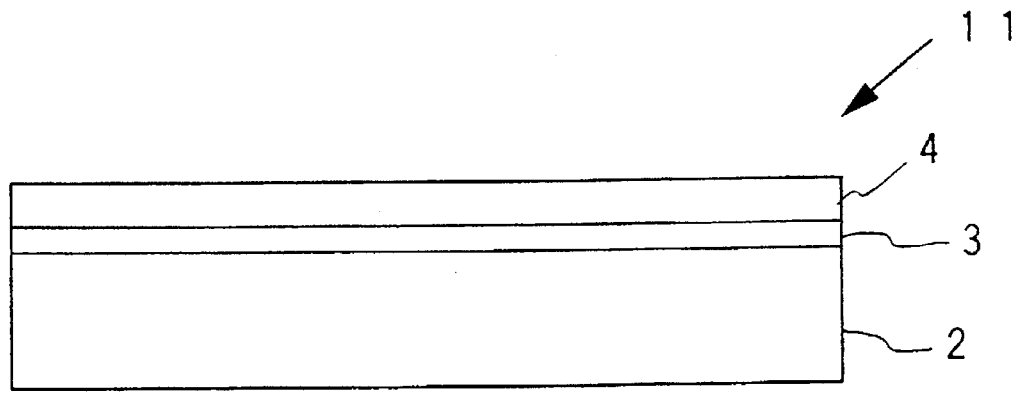
FIG. 2 is a cross-sectional view of another embodiment of a recording material according to the present invention wherein the recording material 11 comprises a plastic film 2, ionizing radiation cured resin layer 3 and image-forming layer 4.
Figure 3:
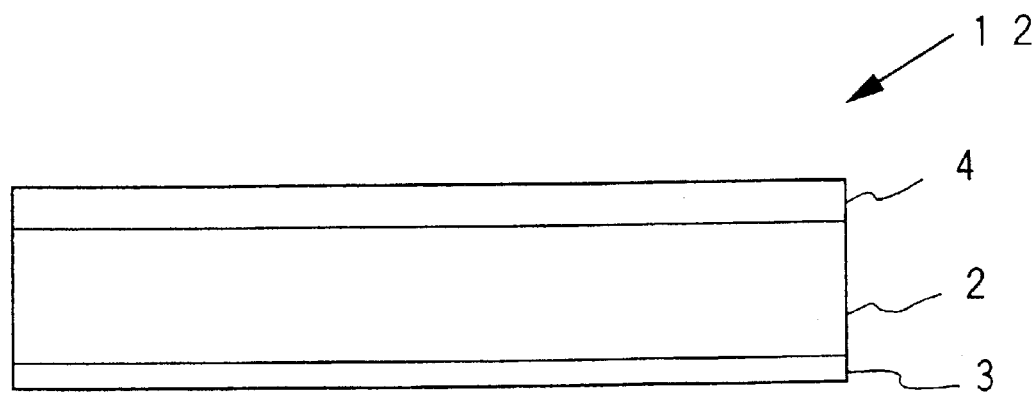
FIG. 3 is a cross-sectional view of an embodiment of a recording material according to the present invention wherein the recording material 12 comprises a plastic film 2, ionizing radiation cured resin layer 3 and image-forming layer 4.
Figure 4:
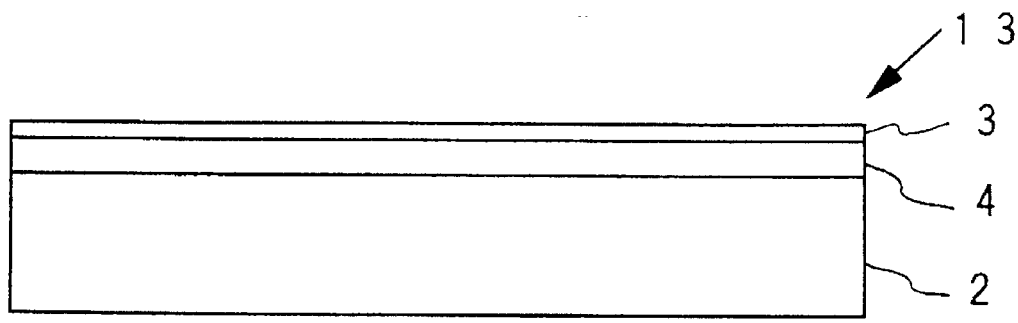
FIG. 4 is a cross-sectional view of an embodiment of the recording material according to the present invention wherein the recording material 13 comprises a plastic film 2, ionizing radiation cured resin layer 3 and image-forming layer 4.
Figure 5:
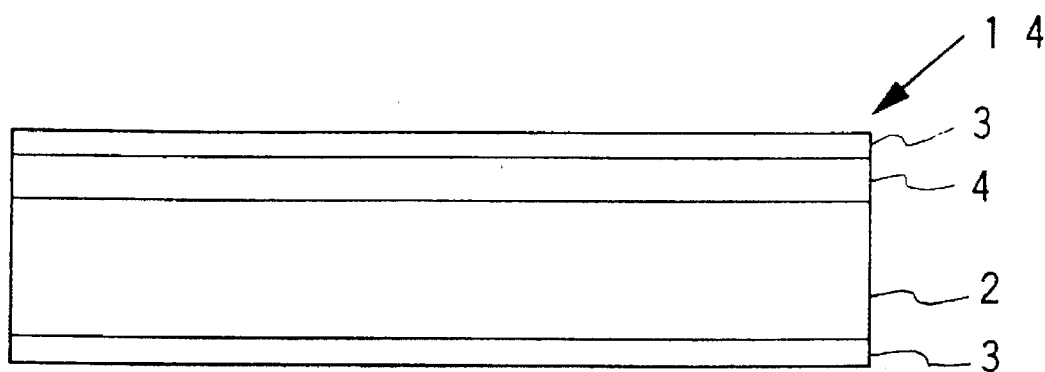
FIG. 5 is a cross-sectional view of an embodiment of the recording material according to the present invention wherein the recording material 14 comprises a plastic film 2, ionizing radiation cured resin layers 3 and image-forming layer 4.

The recording material of the present invention may have, for example, a structure shown in FIG. 1 where the recording material 1 comprises a plastic film 2 which is provided with ionizing radiation cured resin layers 3 on both of its surfaces and an image-forming layer 4 provided on one of the ionizing radiation cured resin layers 3. The recording material of the present invention may alternatively have a structure shown in FIG. 2 where the recording material 11 comprises a plastic film 2 which is provided with an ionizing radiation cured resin layer 3 and an image-forming layer 4 provided In this order on its one surface. The recording material of the present invention may alternatively have a structure shown in FIG. 3 where the recording material 12 comprises a plastic film 2 which is provided with an ionizing radiation cured resin layer 3 on its one surface and an image-forming layer 4 on the other surface. The recording material of the present invention may alternatively have a structure shown in FIG. 4 where the recording material 13 comprises a plastic film 2 which is provided with an image-forming layer 4 and an ionizing radiation cured resin layer 3 in this order on its one surface. The recording material of the present invention may alternatively have a structure shown in FIG. 5 where the recording material 14 comprises a plastic film 2 which is provided with an ionizing radiation cured resin layer 3 on its one surface and an image-forming layer 4 and an ionizing radiation cured resin layer 3 on the other surface.

The plastic film 2 is a support of the recording material and any materials may be used for it so long as they function as a support. Examples of such materials are, for example, polyethylene terephthalates, polybutylene terephthalates, polycarbonates, polypropylenes, polyethylenes, acetylcelluloses, vinyl chloride resins, fluorocarbon resins and the like. Those subjected to a stretching process, in particular biaxial stretching, are preferred since they have improved mechanical strength and dimensional stability.

The thickness of the plastic film may be suitably selected depending on the material used and It generally ranges from 4 to 250 µm.

The ionizing radiation cured resin layers 3 provided on the both surfaces or one surface of the support directly hold the plastic film therebetween and fix it or fix it directly on one of its surfaces to prevent deformation of the plastic film caused by heat and moisture. When it is provided on the image-forming layer 4, it indirectly fixes the plastic film to prevent deformation of the plastic film caused by heat and moisture.

These ionizing radiation cured resin layers are formed from an ionizing radiation curable paint containing a resin curable by irradiation of electron beam or ultraviolet (UV) rays.

The ionizing radiation curable paint contains photopolymerizable prepolymers, photopolymerizable monomers and photopolymerization initiators and, optionally, additives such as sensitizers, pigments, fillers, non-reactive resins and leveling agents and solvents.

Structure, functionality and molecular weight of the photopolymerizable prepolymers influence on the curing of the ionizing radiation curable paint, and they determine the properties of the ionizing radiation cured layer such as adhesive property, hardness and anti-crack property. Photopolymerizable prepolymers have functional groups introduced into their skeletons, which may cause radical polymerization and/or cation polymerization when radiated by ionizing radiation. Those which undergo radical polymerization are particularly preferred since they show higher curing rate and hence provide a high degree of freedom with respect to the resin design.

As the radical polymerizable prepolymers, acrylic prepolymers having acryloyl groups are particularly preferred. They may have two or more acryloyl groups per molecule and can form three dimensional reticular structure. As the acrylic prepolymers, urethane acrylates, epoxyacrylates, melamine acrylates, polyester acrylates and the like may be used.

The photopolymerizable monomers are used to improve workability of the photopolymerizable prepolymer, which has high viscosity, by diluting it to lower viscosity, and to impart coating strength as crosslinking agents. As the photopolymerizable monomers, one or more of monofunctional acrylic monomers such as 2-ethylhexyl acrylate, 2-hydroxyethyl acrylate, 2-hydroxypropyl acrylate and butoxyethyl acrylate; bifunctional acrylic monomers such as 1,6-hexanediol acrylate, neopentyl glycol diacrylate, diethylene glycol diacrylate, polyethylene glycol diacrylate and hydroxypivalate neopentyl glycol acrylate; polyfunctional acrylic monomers such as dipentaerythritol hexaacrylate, trimethylpropanetriacrylate and pentaerythritol triacrylate and the like may be used.

As the amount of the photopolymerizable monomers added to the paint is increased, the coating becomes harder. Therefore, its mixing ratio should be suitably selected so that the desired hardness or desired flexibility can be obtained. When the film is to be used as a support for another material, its hardness may be adjusted in accordance with the properties desired for the specific intended use of the support. For example, for a use where the films are bended or folded, their hardness may be adjusted by mixing non-reactive resins, excellent in flexibility, to obtain desired flexibility. As such non-reactive resins, thermosetting or thermoplastic acrylic resins, epoxy resins and the like may be used.

The photopolymerization initiators have a catalytic function and added to initiate the polymerization reactions of acryloyl groups upon exposure to ionizing radiation for a short period and to accelerate the reaction. The photopolymerization initiators are particularly required when the curing is performed by UV radiation, while sometimes they are not needed when an electron radiation with high energy is used. The photopolymerization initiators include those causing radical polymerization by cleavage, those causing radical polymerization by abstracting hydrogen atoms and those causing cation polymerization by generating ions. Any such photopolymerization initiators can be used for the present invention and they include photopolymerization initiators for radical polymerization such as benzoin ethers, ketals, acetophenones, thioxanthones and the like and photopolymerization initiators for cation polymerization such as diazo compounds, diaryliodonium salts, triarylsulfonium salts, triarylpyrylium salts, benzylpyridinium thiocyanate, dialkylphenacylsulfonium salts, dialkylhydroxyphenylsulfonium salts, dialkylhydroxyphenylphosphonium salts and the like and complex types. One or more of such photopolymerization initiators can be used. The photopolymerization initiators are mixed in an amount of 2 to 10% by weight, preferably 3 to 6% by weight based on the solid matter of the resin.

The ionizing radiation curable paint may contain a matting agent to improve writing property of the coating. As the matting agent, silica, titanium oxide, zinc oxide, calcium carbonate, barium sulfate, magnesium oxide and the like can be used. The matting agent may be mixed in an amount of 10 to 200% by weight, preferably 20 to 100% by weight based on the solid matter of the resin.

Further, the ionizing radiation curable paint may contain additives such as sensitizers, pigments, fillers, non-reactive resins and leveling agents as desired. The compositions may be diluted with solvents compatible with them to form paints.

In order to form the ionizing radiation cured resin layer, the ionizing radiation curable paint is coated onto a plastic film and radiated with electron beam or UV rays. The ionizing radiation curable paint may be applied to a plastic film by any conventional coating method such as Mayer bar coating, blade coating, gravure coating, spin coating or spray coating.

In order to cure the ionizing radiation curable paint, it is radiated with an electron beam or UV rays. When the radiation is carried out with an electron beam, an electron beam with an energy of accelerating voltage of not more than 1000 keV, preferably 100 to 300 keV, and a wavelength of not more than 100 nm may be radiated by using an electron radiation accelerator of the scanning type or the curtain type. When the radiation is carried out with UV rays, UV rays with a wavelength of from 100 to 400 nm, preferably 200 to 400 nm and an energy of 71 to 285 kcal/mol may be radiated by ultrahigh pressure mercury lamps, high pressure mercury lamps, low pressure mercury lamps, carbon arc, xenone arc, metal halide lamps and the like.

When the ionizing radiation curable paint coated on a plastic film is cured by irradiating it with an electron beam or UV radiation, the curing may be greatly influenced by the presence of oxygen and the thickness of the coating. Radicals generated by the radiation of ionizing radiation capture oxygen and hence the presence of oxygen inhibits the curing. Therefore, the thinner the thickness of the coating, the larger the ratio of the surface area relative to the volume of the coating becomes and the curing becomes more likely to be inhibited by oxygen in air. On the other hand, when the thickness of the coating is too large, it becomes difficult for the ionizing radiation to permeate into the inside of the coating. As a result, curing of the deeper portion becomes insufficient, while the surface portion may be cured, and poor adhesion between the layer of ionizing radiation cured resin and the polyester film is caused due to the presence of the uncured interfacial portion. In order to avoid such Inhibition of curing or an uncured portion, the radiation by electron beam, in particular, can be performed in the presence of an inert gas such as $N_2$ gas. Further, by adjusting the thickness of the coating, employing photopolymerizable prepolymers and photopolymerizable monomers of high curing rate and increasing the amount of the photopolymerization initiator to be added, the inhibition of curing may be prevented.

The hardness of the ionizing radiation cured resin layer should be equal to or higher than a pencil hardness of H, preferably 2H, determined according to JIS-K5400. When it is softer than H, deformation of the plastic films by humidity or heat cannot be effectively prevented.

The thickness of the ionizing radiation cured resin layer may vary depending on material and thickness of the plastic film used. That is, if the plastic film having a lower softening temperature or a greater thickness is used, the ionizing radiation cured resin layer should have a relatively larger thickness. However, even though a thick plastic film is used, if it is used for a purpose where a relatively short heating time is used, heat is not easily transmitted to the inside of the film and hence it is not likely to be deformed. Accordingly, in such a case, a relatively lower thickness of the layer may be used. As described above, the thickness of the ionizing radiation cured layer cannot be definitely defined, but it may be 1 to 30 μm, preferably 3 to 10 μm, when it is coated on a polyester film and used as a copy material of the thermal developing type which are thermally developed at a temperature of 130° C. for 5 seconds.

The image-forming layer 4 provided on the ionizing radiation cured resin layer 3 or on the plastic film 2 can utilize various image-forming methods utilizing pressure, heat, light exposure and the like.

For example, the image-forming layer may be composed of a plurality of layers comprising at least one containing the coloring agent and at least one containing the color developing agent, adjacent two of which containing the coloring agent and the color developing agent respectively are optionally separated by a separator layer. Further, either one of the coloring agent, the color developing agent and the base may be encapsulated in microcapsules. Microcapsules may be those which can be broken by pressure, those which can be made permeable for the agents by heating or the like.

Combination of the coloring agent and the color developing agent utilized in the image-forming layer may be a combination of a diazo compound and a coupler. In such a case, the image-forming layer may composed of a layer containing a diazo compound and a layer containing a coupler and a base, the layers optionally being separated by a separator layer. Alternatively, the image-forming layer may comprise a diazo compound, a coupler and a base in the same layer where the diazo compound or the coupler is encapsulated in microcapsules.

In such image-forming layers as described above, images can be formed by breaking the separator layers or microcapsule walls with pressure applied by typewriters or the like to make the diazo compound and the coupler react in the presence of the base to develop color. Alternatively, images can be formed by melting the separator layers or increasing permeability of microcapsule walls with heat applied by thermal head or the like to make the diazo compound and the coupler react to develop color. After desired images are formed, the images may be fixed by exposing the layer to light to decompose and inactivate the diazo compound in background areas other then the image areas. Alternatively, background areas other than image areas may be first exposed to light to decompose and inactivate the diazo compound in the background areas and thereafter heating is performed to make the diazo compound and the coupler in the image areas react to develop color and thus form images.

As the diazo compound, any of aromatic diazonium compounds, diazo sulfonate compounds, diazo amino compounds and the like may be used. The coupler is a compound which reacts with the diazo compound to develop color, and resorcins, phloroglucins and the like may be used as the coupler. The base may be any substance so long as it shows properties of a base, and it may be ammonium salts, organic amines, organic amide and the like.

The image-forming layer may also contain a leuco dye, an oxidizing agent, as the coloring agent and the color developing agent, and a reducing agent. In such a case, the image-forming layer may be composed of a plurality of layers comprising at least one containing a leuco dye and an oxidizing agent and at least one containing a reducing agent, adjacent two of which containing the leuco dye and the oxidizing agent, and the reducing agent respectively are optionally separated by a separator layer. Alternatively, the image-forming layer may contain a leuco dye, an oxidizing agent and a reducing agent in the same layer where the leuco dye and the oxidizing agent are encapsulated in microcapsules.

In such image-forming layers described above, images can be formed by exposing the layers to light image-wise to activate the oxidizing agent and develop color of the leuco dye so that desired images can be obtained. Then, the image can be fixed by breaking the separator layers or microcapsule walls with pressure, or melting the separator layers or increasing permeability of microcapsule walls with heat applied by thermal heads or the like to cause reaction of the oxidizing compound and the reducing agent so that the oxidizing agent in the background areas other than image areas can be inactivated by the reducing agent. Alternatively, latent images of desired patterns may be first formed by thermal heads or the like and then the layer may be exposed to light to activate the oxidizing agent and develop color of the leuco dye so that desired images can be fixed.

The leuco dye is a compound having one or two hydrogen atoms which can develop color when the hydrogen atoms are extracted or electrons are added. The leuco dye may be any of those selected from aminotriarylmethanes, aminoxanthenes, aminodiphenylmethanes, hydrazines and the like. The oxidizing agent is a compound which can be, upon light exposure, activated and cleaved to generate a free radical(s), which makes the leuco dye develop color. The oxidizing agent may be any of those selected from lophine dimer compounds, halogenated hydrocarbons, azido compounds, benzophenones, polynucleus quinones and the like. The reducing agent may be a substance which can bind to free radicals of the activated oxidizing agent. The reducing agent may be any of those selected from hydroquinones, catechols, cyclic Phenylhydrazides and the like.

The image-forming layer may also utilize a photopolymerizable monomer and a polymerization initiator as a color developing system. In such a case, the image-forming layer may contain a coloring agent which develops color by binding of two components as well as a photopolymerizable monomer and a polymerization initiator. Alternatively, it may contain a photopolymerizable monomer which itself acts as a color developing agent, i.e., reacts with a coloring agent to develop color, together with a polymerization initiator and the coloring agent. In the case of the image-forming layer containing a coloring agent which develops color by binding of two components, the image-forming layer may comprise a layer containing one of the two components of the coloring agent and another layer containing the other component of the coloring agent, a photopolymerizable monomer and a polymerization initiator, or it may contain the above components in the same layer either one of which is encapsulated in microcapsules. In the case of an image-forming layer containing a photopolymerizable monomer which itself acts as a color developing agent, the image-forming layer may comprise a layer containing the photopolymerizable monomer and the polymerization initiator and a layer containing the coloring agent, these layers optionally being separated by a separator layer, or it may comprise the above components in the same layer either one of which is encapsulated in microcapsules.

In the case of the image-forming layer containing a coloring agent which develops color by binding of two components, images are formed by exposing the layer to light image-wise or non-image-wise to cause polymerization of the photopolymerization monomer and heating the layer. When the layer is heated, dispersion of the coloring agent is inhibited by the presence of polymers and hence binding of the two components is inhibited in areas where the photopolymerization monomer has been polymerized, whereas the coloring agent may be dispersed in areas not exposed to light. Thus, desired images can be formed. In the case of the image-forming layer containing a photopolymerizable monomer which itself acts as a color developing agent, images are formed by exposing the layer to light image-wise or non-image-wise to cause polymerization of the photopolymerizable monomer and heating the layer to melt the separator layer or to increase permeability of microcapsule walls so that the photopolymerizable monomer in areas not exposed to light can bind to the coloring agent to form images of desired shapes.

As the coloring agent of the two-component type, combinations of a lactone compound such as crystal violet lactone and a bisphenol compound such as bisphenol A, combinations of a metal salt of aliphatic acid such as ferric stearate and an organic reducing agent, sulfur compound or amino compound or other various agents may be used. As the photopolymerizable monomer, there can be mentioned acrylamide, barium acrylate and the like. As the polymerization initiator, benzoyl peroxide, azobisisobutyronitrile and the like may be used. Preferred photopolymerizable monomers which themselves act as a color developing agent are those having vinyl groups or vinylidene groups and acidic groups such as carboxyl groups, sulfonic acid groups and phosphoric acid groups in their molecules, and their examples include methacryloyloxyethyl phthalate and the like. As the coloring agent, lueco dyes which develop color under acidic condition and the like may be used. Any substances which can initiate photopolymerization may be used as the polymerization initiator and examples of such substances include aromatic ketones and the like.

Further, the image-forming layer may be formed as a layer capable of developing various colors, i.e., forming multi-color images. Image-forming layers capable of forming multi-color images and utilizing diazo compounds may utilize a plurality of diazo compounds which show different photodecomposition wavelengths and are contained in microcapsules of which permeability varies depending on temperature. In image-forming in such image-forming layers as described above, layers are heated image-wise at a temperature of $T_1$ to cause reaction of a first diazo compound and a coupler encapsulated in microcapsules contained in a first layer to develop color and then the diazo compound of the first layer present in background areas is inactivated by light at a wavelength of $\lambda_1$ to fix images. Thereafter, a diazo compound of a second layer is made develop color at a temperature of $T_2$ and images are fixed by light at a wavelength of $\lambda_2$ in a similar manner. Images can be formed in a third and other layers in a similar manner.

Image-forming layers capable of forming multi-color images utilizing leuco dyes may comprise a plurality of layers each containing one of different leuco dyes which develop different colors and one of oxidizing agents sensitive to lights of different wavelengths. Alternatively, image-forming layers of this type may comprise photooxidizing agents sensitive to lights of different wavelengths and leuco dyes encapsulated in microcapsules in the same layer. In such image-forming layers, multi-color images are formed by exposing the layers to lights of corresponding wavelengths to cause reaction of the leuco dyes and the oxidizing agents to develop colors so that multi-color images can be formed. Thereafter, the images may be fixed by treating them with a reducing agent, or breaking the microcapsules with pressure or increase permeability of microcapsule walls with heat to cause reaction of the reducing agent and the oxidizing agent.

Image-forming layers capable of forming multi-color images utilizing photopolymerizable monomers may comprise a plurality of layers each containing one of different coloring agents developing different colors and one of different photopolymerizable monomers polymerizable by lights of different wavelengths. Alternatively, image-forming layers of this type may comprise photopolymerizable monomers sensitive to lights of different wavelengths and color developing agents encapsulated in microcapsules in the same layer. In such image-forming layers, multi-color images are formed by exposing background area of the layers to lights of corresponding wavelengths to cause polymerization of the photopolymerizable monomers to form latent images corresponding to each of the colors. Thereafter, the images may be formed by breaking the microcapsules with pressure or increase permeability of microcapsule walls with heat to cause reaction of the color developing agent and the photopolymerizable monomers to make the color developing agents develop their specific colors.

The image-forming layers capable of forming multi-color Images may optionally comprise the diazo compounds, the leuco dyes or the photopolymerizable monomers mentioned above in combination. For example, image-forming layers of this type may comprise two layers one of which contains a diazo compound and the other contains another diazo compound which develops color at a wavelength different from that where the former diazo compound develops color, either one of the diazo compounds, couplers and solid bases being encapsulated in microcapsules in each layer, and another layer laminated on the two layer containing a leuco dye which reacts and develops color at a wavelength different from those at which the diazo compounds develop color and an oxidizing agent, either one of which is encapsulated in microcapsules.

The image-forming layer described above are prepared by providing a paint containing the coloring agents, the color developing agents and the like mentioned above dissolved or dispersed in a solvent together with a binder, applying the paint onto a plastic film or an ionizing radiation cured resin layer and curing the coated paint. Coating may be carried out by a conventional technique.

Those recording materials having any of the structures described above show substantially no waving phenomenon even if they are used for a machine utilizing a temperature of more than 100° C. for image-forming. Further, the petal phenomena are markedly reduced when they are left in high humidity in a stacked or rolled form.

It is considered that the waving phenomenon caused by heat is prevented by a high softening temperature and a high hardness of the ionizing radiation cured resin layer. That is, since the ionizing radiation cured resin layers are provided on the both surfaces of the plastic film or the plastic film is fixed by the ionizing radiation cured resin layer on its one surface, the plastic film cannot be deformed even though it is softened by heat. Further, resistance of the structure to heat transmission to the plastic film is considered to contribute to prevention of the waving phenomena.

In addition, the petal phenomena caused by humidity are also reduced and this is considered to be due to the fact that, since the plastic film is held between the ionizing radiation cured resin layers or fixed by the ionizing radiation cured resin layer on its one surface, the plastic film cannot be deformed even though the edges of the film absorb moisture.

The above-described embodiment are exemplary ones and the present invention is not limited thereto. For instance, an adhesion layer may be interposed between the plastic film and the ionizing radiation cured resin layer or between the image-forming layer and the ionizing radiation cured resin layers and the plastic film may be subjected to a treatment for enhancement of adhesion.

Because of the ionizing radiation cured resin layers containing photopolymerizable prepolymers, photopolymerizable monomers and polymerization initiators and having a hardness equal to or harder than a pencil hardness of H, the recording materials of the present invention show substantially no waving of films when they are heated and the petal phenomena are markedly reduced and they can maintain good flatness when stacked sheets or rolls of the recording materials are left in high temperature and high humidity.

EXAMPLES

The present invention will be further explained by referring to the following working examples. The expressions of "part" and "%" used herein mean "part by weight" and "% by weight" unless otherwise indicated.

Example

An ionizing radiation curable paint having the following composition was prepared and coated by a Mayer bar on one surface of a polyester film having a thickness of 50 µm, whose both surfaces had been subjected to adhesion enhancement treatment. The coated resin layer was irradiated by a UV ray for 1 to 2 seconds by means of a high pressure mercury lamp to provide an ionizing radiation cured resin layer having a thickness of 7.0 µm.

| Composition of Ionizing Radiation Curable Resin | |
|---|---|
| | (solid matter: 23% by weight) |
| UV Curable acrylic resin (UniDic 17-806: Dainippon Ink & Chemicals Inc.) | 13.0 parts |
| Photopolymerization initiator (IrgaCure 651: Ciba Geigy Ltd.) | 0.3 parts |
| Matting agent (silica) (Sylysia 740: Fuji Silysia Chemical Co., Ltd.) | 4.5 parts |
| Matting agent (silica) (Aerosil R-974: Nippon Aerosil Co., Ltd.) | 0.8 parts |
| Methyl ethyl ketone | 18.0 parts |
| Toluene | 23.0 parts |
| Butyl acetate | 10.0 parts |

On the other hand, 3.45 parts of 1-morpholino-2,5-dibutoxybenzene-4-diazonium haxafluorophosphate salt and 18 parts of adduct of xylylene diisocyanate and trimethylolpropane (3:1) were added to a mixed solvent of 6 parts of tricresyl phosphate and 5 parts of ethyl acetate and dissolved by heating. This diazo compound solution was added to an aqueous solution of 5.2 parts of polyvinyl alcohol in 58 parts of water and emulsified at 20° C. to obtain an emulsion containing particles having an average diameter of 2.5 µm. To the resulting emulsion, 100 parts of water was added and heated to 60° C. with stirring and microcapsules containing the diazo compound as a core substance were obtained 2 hours later (diazo component solution).

Then, 10 parts of 2-hydroxy-3-naphtoic acid anilide and 10 parts of triphenylguanidine were added to 200 parts of a 54 aqueous solution of polyvinyl alcohol and dispersed by a sand mill for about 24 hours to obtain a dispersion containing particles of an average diameter of 3 µm (coupler component solution).

To 50 parts of the above-obtained diazo component solution, 50 parts of the coupler component solution and 10 parts of 40% dispersion of calcium carbonate were added to obtain an image-forming layer coating solution.

The image-forming layer coating solution prepared above was applied by a Mayer bar to one surface of the polyester film opposite to the surface provided with the ionizing radiation cured resin layer to form an image-forming layer having a thickness of 3 µm, thereby formed a recording material of the present invention.

Comparative Example

A thermosetting resin paint having the same composition as the ionizing radiation curable resin used in the above example, excepting that it contained the following components instead of the UV curable acrylic resin and the photopolymerization initiator was prepared and coated by a Mayer bar on one surface of a polyester film having a thickness of 50 µm, whose both surfaces had been subjected to adhesion enhancement treatment. The coated resin layer was subjected to a heat treatment at 150° C. for 1 minute and 30 seconds to provide a thermosetting resin layer having a thickness of 7.0 μm.

| | |
|---|---|
| Acrylic Polyol (AcryDic A-814: Dainippon Ink & Chemicals Inc.) | 17.5 parts |
| Isocyanate curing agent (Takenate D-110N: Takeda Chemical Industries, Ltd.) | 2.6 parts |

An image-forming layer identical to that of the above example was formed on one surface of the polyester film opposite to the surface provided with the thermosetting resin layer, thereby formed a recording material.

Test for evaluating petal phenomena

The recording material obtained in Example was cut into sheets having a size of 594×841 mm. The sheets (100 sheets) were stacked and left at a temperature of 36.5° C. and a relative humidity of not less than 90% for 24 hours. As a result of visual evaluation, it was found that substantially no petal phenomena had occurred.

Then, the recording material utilizing thermosetting resin which had been obtained in Comparative Example was cut and stacked as described above and left under the same conditions as described above. As a result, serious petal phenomena were observed in edges of the sheets.

As clearly seen from the above results, few petal phenomena were observed in the recording material of the present invention, and it was observed that it maintained flatness under the high humidity condition.

Test for evaluating waving caused by high temperature

By using the recording material obtained in Example, a printing process was carried out in a diazo copier of the heat developing type (COPIART 100: Fuji Photo Films Co.,Ltd) at a developing temperature of 130° C. with a heating time of 5 seconds.

The recording material of Example after the printing showed no waving and was like the film before the printing in this regard.

Then, by using the recording material utilizing thermosetting resin of Comparative Example, a printing process was carried out under the same conditions as described above. The printing process can be finished with the recording material utilizing thermosetting resin without causing Jamming, but a large number of waves having heights of 5 mm or more and it was not practically acceptable.

As clearly seen from the above results, no temperature dependent waving was observed and the flatness was remarkably improved in the recording material of the present invention.

Because of the ionizing radiation cured layers provided in recording materials having various image-forming layers on plastic films, rippling of the whole film is not seen in the recording materials of the present invention even when heated to a temperature exceeding the glass transition point of the plastic films, occurrence of the petal phenomenon is prevented and good flatness is maintained when the materials in the form of stacked sheets or rolls are left under circumstances of high temperature and high humidity.

What is claimed is:

1. A recording material comprising a plastic film provided with a layer of ionizing radiation cured resin having a hardness equal to or harder than a pencil hardness of H and an image-forming layer having pressure sensitivity or thermal sensitivity or photosensitivity and thermal sensitivity.

2. The recording material of claim 1 which comprises the plastic film which is provided on at least one of its surfaces with the layer of ionizing radiation cured resin and the image-forming layer provided on the plastic film or on the layer of ionizing radiation cured resin.

3. The recording material of claim 1 which comprises the plastic film which is provided on both of its surfaces with the layers of ionizing radiation cured resin and the image-forming layer provided on at least one of the layers of ionizing radiation cured resin.

4. The recording material of claim 1 which comprises the plastic film which is provided on at least one of its surfaces with the layer of ionizing radiation cured resin and the image-forming layer in this order.

5. The recording material of claim 1 which comprises the plastic film which is provided on one of its surfaces with the image forming layer and on the opposite surface with the layer of ionizing radiation cured resin.

6. The recording material of claim 1 which comprises the plastic film which is provided on at least one of its surfaces with the image-forming layer and the layer of ionizing radiation cured resin in this order.

7. The recording material of claim 1 which comprises a plastic film which is provided on one of its surfaces with the image-forming layer and the layer of ionizing radiation cured resin in this order and on the opposite surface with the layer of ionizing radiation cured resin.

8. The recording material of claim 1 wherein the image forming layer is composed of one layer comprising a coloring agent and a color developing agent.

9. The recording material of claim 8 wherein either the coloring agent or the color developing agent is encapsulated in microcapsules which can be broken by pressure.

10. The recording material of claim 8 wherein either the coloring agent or the color developing agent is encapsulated in microcapsules which can be made permeable for the agents by heating.

11. The recording material of claim 1 wherein the image-forming layer is composed of a plurality of layers comprising at least one containing a coloring agent and at least one containing a color developing agent.

12. The recording material of claim 11 wherein either the coloring agent or the color developing agent is encapsulated in microcapsules which can be broken by pressure.

13. The recording material of claim 11 wherein either the coloring agent or the color developing agent is encapsulated in microcapsules which can be made permeable for the agents by heating.

14. The recording material of claim 1 wherein the image-forming layer comprises a diazo compound, a coupler and a solid base.

15. The recording material of claim 14 wherein the image-forming layer is composed of a plurality of layers each containing one of different diazo compounds so that the layers can develop different colors, each of the diazo compounds or a coupler contained in each of the layers being encapsulated in microcapsules which have thermopermeability properties different in every layer.

16. The recording material of claim 1 wherein the image-forming layer comprises a leuco dye, an oxidizing agent and a reducing agent.

17. The recording material of claim 16 wherein the image-forming layer is composed of a plurality of layers each containing one of different leuco dyes which bind with an oxidizing agent at different wavelengths so that the layers can develop different colors.

18. The recording material of claim 16 wherein the image-forming layer comprises a layer containing a leuco dye and a layer comprising a diazo compound which decomposed at a wavelength different from that at which the leuco dye develops color.

19. The recording material of claim 1 wherein the image-forming layer comprises a photopolymerizable monomer and a polymerization initiator.

20. The recording material of claim 19 wherein the image-forming layer is composed of a plurality of layers each containing one of different photopolymerizable monomers which undergo polymerization at different wavelengths and one of different coloring agents developing different colors.

* * * * *

UNITED STATES PATENT AND TRADEMARK OFFICE
CERTIFICATE OF CORRECTION

PATENT NO. : 5,637,549
DATED : June 10, 1997
INVENTOR(S) : Yoshihisa KIMURA

It is certified that error appears in the above-indentified patent and that said Letters Patent is hereby corrected as shown below:

Col. 4, line 62, "In" should read --in--.

Col. 7, line 28, "Inhibition" should read --inhibition--.

Col. 9, line 15, "Phenylhydrazides" should read --phenylhydrazides--.

Col. 11, line 2, "Images" should read --images--.

Col. 12, line 43, "54" should read --5%--.

Col. 13, line 47, "Jamming" should read --jamming--.

Signed and Sealed this

Sixteenth Day of June, 1998

Attest:

BRUCE LEHMAN

Attesting Officer

Commissioner of Patents and Trademarks